United States Patent
Yoneda et al.

(10) Patent No.: US 10,784,456 B2
(45) Date of Patent: Sep. 22, 2020

(54) ORGANIC ELECTROLUMINESCENT UNIT

(71) Applicant: JOLED INC., Tokyo (JP)

(72) Inventors: Kazuhiro Yoneda, Tokyo (JP); Tatsuya Matsumi, Tokyo (JP); Noriyuki Matsusue, Tokyo (JP)

(73) Assignee: JOLED INC., Tokyo (JP)

( * ) Notice: Subject to any disclaimer, the term of this patent is extended or adjusted under 35 U.S.C. 154(b) by 87 days.

(21) Appl. No.: 15/993,567

(22) Filed: May 30, 2018

(65) Prior Publication Data

US 2018/0351124 A1 Dec. 6, 2018

(30) Foreign Application Priority Data

Jun. 6, 2017 (JP) ................................ 2017-111505
Jun. 8, 2017 (JP) ................................ 2017-113265

(51) Int. Cl.
| | | |
|---|---|---|
| *H01L 29/08* | (2006.01) | |
| *H01L 33/00* | (2010.01) | |
| *H01L 31/0203* | (2014.01) | |
| *H01L 21/00* | (2006.01) | |
| *H01L 51/40* | (2006.01) | |
| *H01L 51/50* | (2006.01) | |

(52) U.S. Cl.
CPC ...... *H01L 51/5004* (2013.01); *H01L 51/5012* (2013.01); *H01L 51/5016* (2013.01); *H01L 51/5056* (2013.01); *H01L 51/5072* (2013.01); *H01L 2251/552* (2013.01)

(58) Field of Classification Search
CPC ............. H01L 51/5004; H01L 51/5012; H01L 51/5056; H01L 51/5072; H01L 51/5016
See application file for complete search history.

(56) References Cited

U.S. PATENT DOCUMENTS

| | | |
|---|---|---|
| 2008/0231177 A1 | 9/2008 | Nomura et al. |
| 2008/0284318 A1 | 11/2008 | Deaton et al. |
| 2010/0301383 A1 | 12/2010 | Shitagaki et al. |
| 2012/0153268 A1 | 6/2012 | Kawamura et al. |
| 2014/0339522 A1 | 11/2014 | Nonaka et al. |

(Continued)

FOREIGN PATENT DOCUMENTS

| | | |
|---|---|---|
| JP | 2008-270770 A | 11/2008 |
| JP | 2011-9205 A | 1/2011 |

(Continued)

*Primary Examiner* — Alonzo Chambliss
(74) *Attorney, Agent, or Firm* — Hauptman Ham, LLP

(57) ABSTRACT

An organic electroluminescent unit is provided with a plurality of organic electroluminescent elements. At least one of the organic electroluminescent elements includes, in order, a first electrode, a hole transport layer, a light-emitting layer, an electron transport layer, and a second electrode. The hole transport layer, the light-emitting layer, and the electron transport layer satisfy the following expressions:

$\Delta Eg(T1) \geq 0$ eV $\Delta Eg(T1) = E^T_a + E^T_b - 2 \times E^T_{EML}$ where $E^T_a$ represents a T1 level of the hole transport layer, $E^T_b$ represents a T1 level of the electron transport layer, and $E^T_{EML}$ represents a T1 level of the light-emitting layer.

14 Claims, 7 Drawing Sheets

(56) References Cited

U.S. PATENT DOCUMENTS

| | | | | |
|---|---|---|---|---|
| 2015/0263305 A1* | 9/2015 | Premutico | ............ | H01L 51/5016 257/40 |
| 2015/0325795 A1* | 11/2015 | Lee | ...................... | C07D 209/82 257/40 |
| 2016/0163994 A1* | 6/2016 | Park | ....................... | C09K 11/06 257/40 |
| 2016/0322582 A1* | 11/2016 | Qiu | ........................ | C09K 11/06 |
| 2019/0245148 A1* | 8/2019 | Park | ..................... | C07D 333/76 |

FOREIGN PATENT DOCUMENTS

| JP | 2014-225710 A | 12/2014 |
|---|---|---|
| JP | 2015109407 A | 6/2015 |
| WO | 2011086941 A1 | 7/2011 |

\* cited by examiner

ORGANIC ELECTROLUMINESCENT UNIT

CROSS REFERENCE TO RELATED APPLICATIONS

This application claims the benefit of Japanese Priority Patent Application Nos. 2017-111505 filed on Jun. 6, 2017 and 2017-113265 filed Jun. 8, 2017, the entire contents of each of which are incorporated herein by reference.

BACKGROUND

The disclosure relates to an organic electroluminescent unit.

Various organic electroluminescent units, such as organic electroluminescent displays, including organic electroluminescent elements have been proposed as described in Japanese Unexamined Patent Application Publication Nos. 2008-270770, 2011-009205, and 2014-225710, for example.

SUMMARY

There has been a general demand for an organic electroluminescent unit enhancing the performance of organic electroluminescent elements.

It is desirable to provide an organic electroluminescent unit that makes it possible to enhance the performance of organic electroluminescent elements.

An organic electroluminescent unit according to one embodiment of the disclosure is provided with a plurality of organic electroluminescent elements.

At least one of the plurality of organic electroluminescent elements in the organic electroluminescent unit includes, in order, a first electrode, a hole transport layer, a light-emitting layer, an electron transport layer, and a second electrode. The hole transport layer, the light-emitting layer, and the electron transport layer satisfy the following expressions:

$$\Delta Eg(T1) \geq 0 \text{ eV}$$

$$\Delta Eg(T1) = E^T_a + E^T_b - 2 \times E^T_{EML}$$

where $E^T_a$ represents a triplet energy (T1) level of the hole transport layer, $E^T_b$ represents a T1 level of the electron transport layer, and $E^T_{EML}$ represents a T1 level of the light-emitting layer.

An organic electroluminescent unit according to one embodiment of the disclosure is provided with a plurality of organic electroluminescent elements. At least one of the plurality of organic electroluminescent elements in the organic electroluminescent unit includes, in order, a first electrode, a hole transport layer, a light-emitting layer, an electron transport layer, and a second electrode. The light-emitting layer has a light-emitting region. The light-emitting region in the light-emitting layer resides in a portion adjacent to one of the hole transport layer or the electron transport layer. The hole transport layer, the light-emitting layer, and the electron transport layer satisfy the following expression:

$$E^T_{ULL} > E^T_{EML}$$

where $E^T_{ULL}$ represents a T1 level of one of the hole transport layer or the electron transport layer that is more remote from the light-emitting region than the other of the hole transport layer or the electron transport layer, and $E^T_{EML}$ represents a T1 level of the light-emitting layer.

An organic electroluminescent unit according to one embodiment of the disclosure is provided with a plurality of organic electroluminescent elements. At least one of the plurality of organic electroluminescent elements in the organic electroluminescent unit includes, in order, a first electrode, a hole transport layer, a light-emitting layer, an electron transport layer, and a second electrode. The hole transport layer, the light-emitting layer, and the electron transport layer satisfy the following expressions:

$$\Delta Eg(S1) \geq 0 \text{ eV}$$

$$\Delta Eg(S1) = E^S_a + E^S_b - 2 \times E^S_{EML}$$

where $E^S_a$ represents a singlet energy (S1) level of the hole transport layer, $E^S_b$ represents an S1 level of the electron transport layer, and $E^S_{EML}$ represents an S1 level of the light-emitting layer.

An organic electroluminescent unit according to one embodiment of the disclosure is provided with a plurality of organic electroluminescent elements. At least one of the plurality of organic electroluminescent elements in the organic electroluminescent unit includes, in order, a first electrode, a hole transport layer, a light-emitting layer, an electron transport layer, and a second electrode. The light-emitting layer has a light-emitting region. The light-emitting region in the light-emitting layer resides in a portion adjacent to one of the hole transport layer or the electron transport layer. The hole transport layer, the light-emitting layer, and the electron transport layer satisfy the following expression:

$$E^S_{ULL} > E^S_{EML}$$

where $E^S_{ULL}$ represents an S1 level of one of the hole transport layer or the electron transport layer that is more remote from the light-emitting region than the other of the hole transport layer or the electron transport layer, and $E^S_{EML}$ represents an S1 level of the light-emitting layer.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
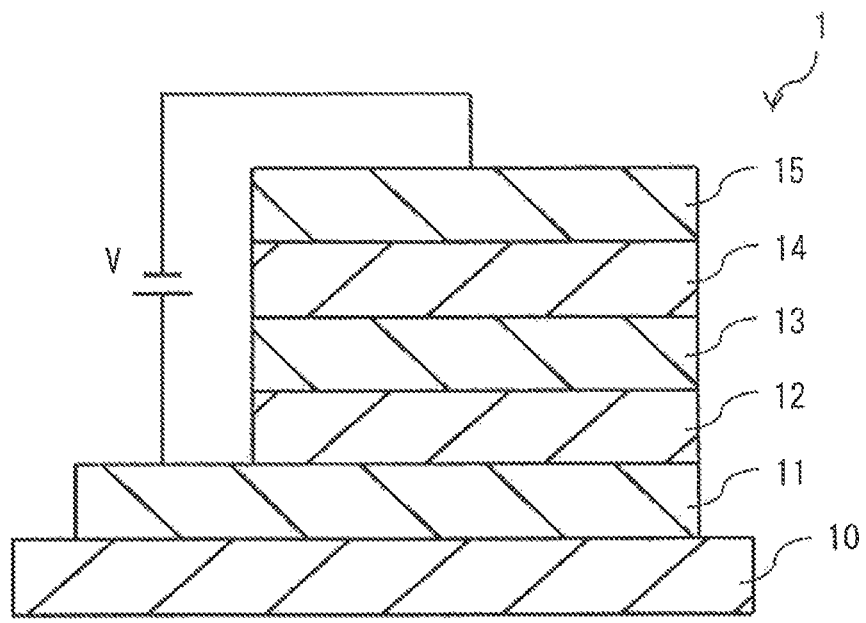
FIG. 1 illustrates an exemplary cross-sectional configuration of an organic electroluminescent element according to one embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Organic Electroluminescent Element)
2. Modification Example of First Embodiment (Organic Electroluminescent Element)
3. Second Embodiment (Organic Electroluminescent Unit)
4. Application Examples (Electronic Apparatus and Illumination Apparatus)

1. First Embodiment

Configuration

FIG. 1 illustrates an exemplary cross-sectional configuration of an organic electroluminescent element 1 according to a first embodiment of the disclosure. The organic electroluminescent element 1 may be on a substrate 10, for example. The organic electroluminescent element 1 includes a hole transport layer 12, a light-emitting layer 13, and an electron transport layer 14, for example. The light-emitting layer 13 is disposed between the hole transport layer 12 and the electron transport layer 14. The hole transport layer 12 is disposed adjacent to a hole-injection side of the light-emitting layer 13, and the electron transport layer 14 is disposed adjacent to an electron-injection side of the light-emitting layer 13. The organic electroluminescent element 1 has a structure that includes, for example, an anode 11, the hole transport layer 12, the light-emitting layer 13, the electron transport layer 14, and a cathode 15, in this order, from the substrate 10. Optionally, the organic electroluminescent element 1 may further include other functional layers, such as a hole injection layer and an electron injection layer.

The substrate 10 may be, for example, a light-transmissive translucent substrate such as a transparent substrate. The substrate 10 may be, for example but not limited to, a glass substrate including a glass material. In another embodiment, the substrate 10 may be a translucent resin substrate including a translucent resin material, such as polycarbonate resin or acrylic resin. In still another embodiment, the substrate 10 may be a thin-film transistor (TFT) substrate that is to be a backplane of an organic electroluminescent (EL) display unit.

The anode 11 may be on the substrate 10, for example. The anode 11 may be, for example but not limited to, a transparent electrode having translucency. For example, the anode 11 may be a transparent electrically-conductive film including a transparent electrically-conductive material, such as indium tin oxide (ITO) or indium zinc oxide (IZO). In another embodiment, the anode 11 may be an electrode including aluminum (Al), silver (Ag), an aluminum alloy, or a silver alloy. In still another embodiment, the anode 11 may be a reflective electrode having light reflectivity, for example. In still another embodiment, the anode 11 may be a laminate of the reflective electrode and the transparent electrode.

The hole transport layer 12 may transport, to the light-emitting layer 13, holes injected from the anode 11. For example, the hole transport layer 12 may be a coated film that is coated with a solution by application and drying of the solution. The solution may contain a hole transporting material 12M as a solute. In other words, the hole transport layer 12 may include the hole transporting material 12M. The hole transporting material 12M as a solute may have an insolubilizing property. The term "insolubilizing property" used herein refers to a property that allows an insolubilizing group such as a cross-linking group and a thermal dissociation soluble group to be chemically transformed by irradiation with heat, ultraviolet rays, or a combination thereof, for example, thereby allowing the chemically transformed group to be insoluble to an organic solvent or water. The hole transport layer 12 may thus be an insolubilized coated film. In another embodiment, the hole transport layer 12 may be a deposited film.

The hole transport layer 12 may include the hole transporting material 12M having the insolubilizing property. Non-limiting examples of the hole transporting material 12M or the raw material of the hole transport layer 12 may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof. For achieving its solubility and insolubilizing property, the hole transporting material 12M may further contain, in a molecular structure thereof, a soluble group, a cross-linking group, or a thermal dissociation soluble group, for example.

The light-emitting layer 13 may emit fluorescent light in a predetermined color through recombination of holes and electrons. For example, the light-emitting layer 13 may be a coated film that is coated with a solution by application and drying of the solution. The solution may contain the organic light-emitting material 13M as a solute, and a solvent, for example. In another embodiment, the light-emitting layer 13 may be a deposited film.

The light-emitting layer 13 may emit light through generation of excitons caused by recombination, in the light-emitting layer 13, of holes injected from the anode 11 and electrons injected from the cathode 15. For example, the light-emitting layer 13 may be a blue-light emitting layer including an organic blue light-emitting material. The organic light-emitting material 13M or the raw material of the light-emitting layer 13 may be, for example but not limited to, a combination of a host material and a fluorescent dopant material. In other words, the light-emitting layer 13 may include, as the organic light-emitting material, the host material and the fluorescent dopant material. The host material may mainly serve to transport charges such as electrons and holes, and the fluorescent dopant material may serve to emit fluorescent light. In another embodiment, the organic light-emitting material 13M may be a combination of two or more host materials and two or more fluorescent dopant materials. In one embodiment, the amount of the dopant material(s) relative to the host material(s) may be in a range from 0.01% by weight to 30% by weight. In another embodiment, the amount of the dopant material(s) relative to the host material(s) may from 0.01% by weight to 10% by weight.

Non-limiting examples of the host material of the light-emitting layer 13 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the fluorescent dopant material of the light-emitting layer 13 may include a pyrene derivative, a fluoranthene derivative, an arylacetylene derivative, a fluorene derivative, a perylene derivative, an oxadiazole derivative, an anthracene derivative, and a chrysene derivative. In another embodiment, the fluorescent dopant material of the light-emitting layer 13 may be a metal complex. The metal complex may contain a ligand and an atom of metal, such as iridium (Ir), platinum (Pt), osmium (Os), gold (Au), rhenium (Re), or ruthenium (Ru).

The light-emitting layer 13 may include an organic light-emitting material having hole mobility higher than electron mobility. In other words, the light-emitting layer 13 may include a material having a high hole transporting property and hole mobility that is higher than electron mobility. The hole transport layer 12 and the electron transport layer 14 may each include a material based on the material of the light-emitting layer 13.

Figure 2:
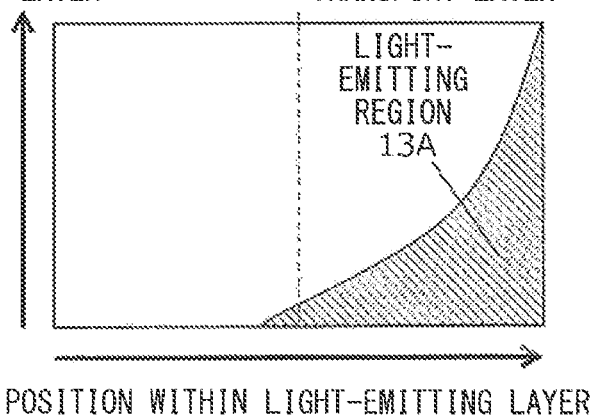
FIG. 2 illustrates an exemplary light-emitting region in a light-emitting layer of FIG. 1.

The light-emitting layer 13 has a light-emitting region 13A. The light-emitting region 13A in the light-emitting layer 13 resides in a portion adjacent to the electron transport layer 14. The light-emitting region 13A refers to the distribution, in the light-emitting layer 13, of the excitons that are generated in the light-emitting layer 13. FIG. 2 illustrates an example of the light-emitting region 13A in the light-emitting layer 13. In FIG. 2, the light-emitting layer 13 is divided in the middle into two portions, i.e., a portion adjacent to the hole transport layer 12 and a portion adjacent to the electron transport layer 14. As used herein, the wording "the light-emitting region 13A may reside in the portion adjacent to the electron transport layer 14" refers to, for example, that 90% or more of the light-emitting region 13A in the light-emitting layer 13 resides in the portion adjacent to the electron transport layer 14, as in FIG. 2. Note that the light-emitting region 13A in FIG. 2 is a mere example. A peak of the light-emitting region 13A may possibly position in an internal portion of the light-emitting layer 13 instead of at the interface of the light-emitting layer 13, for example. The light-emitting region 13A may be changed, for example, by controlling the ratio between the host material and the fluorescent dopant material that are contained in the light-emitting layer 13.

The electron transport layer 14 may transport, to the light-emitting layer 13, electrons injected from the cathode 15. The electron transport layer 14 may be a deposited film. For example, the electron transport layer 14 may include an organic material (hereinafter referred to as electron transporting material 14M) having an electron transporting property. The electron transport layer 14 may include an organic material having a hole-blocking property and a wide energy gap that appropriately prevents deactivation of excitons. The electron transport layer 14 may include an organic material having an energy gap larger than an energy gap in the light-emitting layer 13.

The electron transport layer 14 may be disposed between the light-emitting layer 13 and the cathode 15. The electron transport layer 14 may transport, to the light-emitting layer 13, electrons injected from the cathode 15. In one exemplary embodiment, the electron transport layer 14 may further have a charge-blocking property to suppress tunneling of charges (i.e., holes in the present embodiment) from the light-emitting layer 13 to the cathode 15 and a property to suppress light extinction of the light-emitting layer 13 in an excitation state. The raw material of the electron transport layer 14 or the electron transporting material 14M may be an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transport layer 14 may also contain a metal having an electron transporting property. The electron transport layer 14 containing the metal having the electron transporting property exhibits an enhanced electron transporting property. Non-limiting examples of the metal in the electron transport layer 14 may include barium (Ba), lithium (Li), calcium (Ca), potassium (K), cesium (Cs), sodium (Na), and rubidium (Rb).

The cathode 15 may be, for example but not limited to, a reflective electrode having light reflectivity. For example, the cathode 15 may be a metal electrode including a metal material having light reflectivity. Non-limiting examples of the material of the cathode 15 may include aluminum (Al), magnesium (Mg), silver (Ag), an aluminum-lithium alloy, and a magnesium-silver alloy. In another embodiment, the cathode 15 may be a transparent electrode, such as an ITO film, as with the anode 11. In the present embodiment, the substrate 10 and the anode 11 may have translucency, and the cathode 15 may have light reflectivity. Accordingly, the organic electroluminescent element 1 may have a bottom emission structure that emits light through the substrate 10. In another embodiment, the organic electroluminescent element 1 may have a top emission structure in place of the bottom emission structure.

Figure 3A:
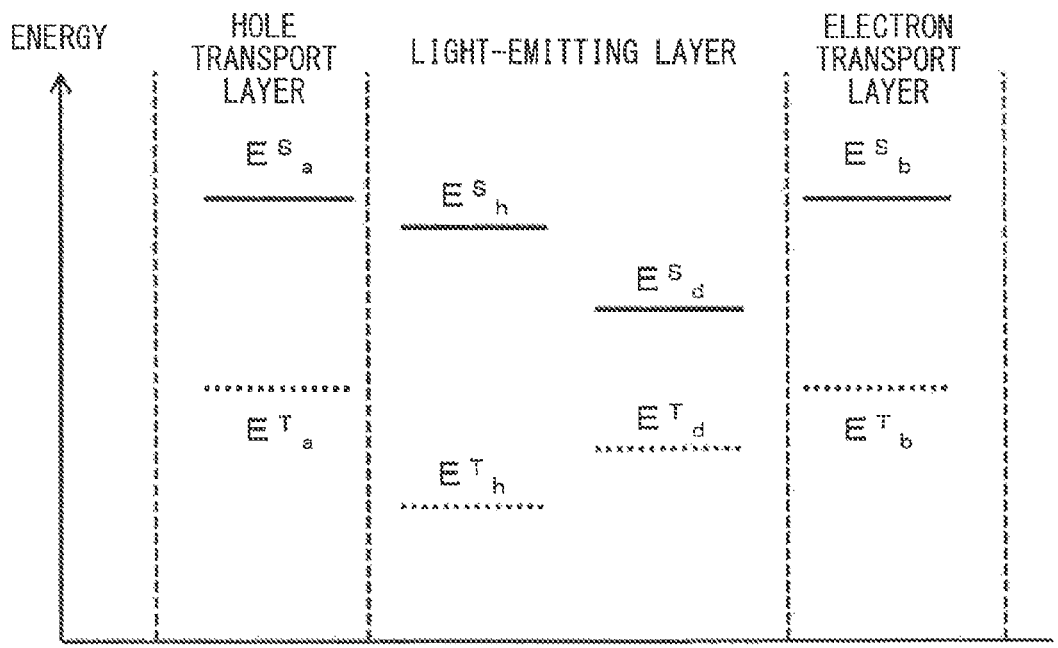
FIG. 3A schematically illustrates exemplary energy levels of respective layers of the organic electroluminescent element of FIG. 1.
Figure 3B:
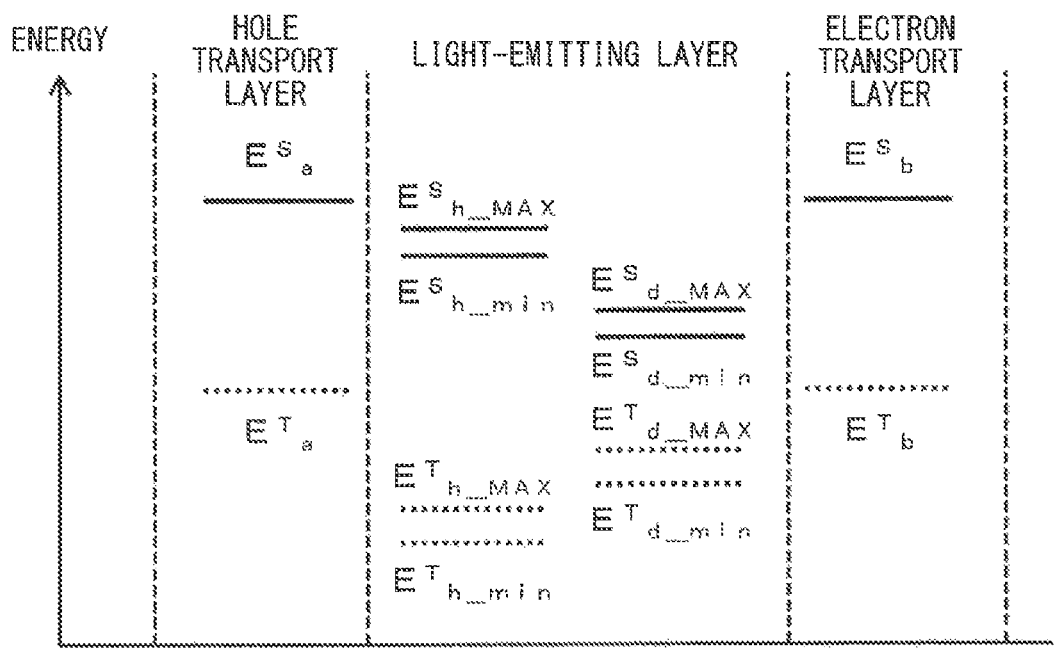
FIG. 3B schematically illustrates exemplary energy levels of respective layers of the organic electroluminescent element of FIG. 1.

Described below are exemplary energy levels of respective layers of the organic electroluminescent element 1. FIGS. 3A and 3B schematically illustrate exemplary energy levels of the respective layers of the organic electroluminescent element 1. FIG. 3A illustrates exemplary energy levels of the respective layers of a sample element that includes the organic light-emitting layer 13 containing one host material and one fluorescent dopant material, whereas FIG. 3B illustrates exemplary energy levels of the respective layers of a sample element that includes the organic light-emitting layer 13 containing two or more host materials and two or more fluorescent dopant materials. In FIGS. 3A and 3B, $E^S_a$ denotes the singlet energy (S1) level of the hole transport layer 12, $E^T_a$ denotes the triplet energy (T1) level of the hole transport layer 12. In FIG. 3A, $E^S_h$ denotes the S1 level of the host material of the light-emitting layer 13, and $E^T_h$ denotes the T1 level of the host material of the light-emitting layer 13. In FIG. 3B, which illustrates exemplary energy levels of the respective layers of the sample that includes the organic light-emitting layer 13 containing two or more host materials, $E^S_{h\_MAX}$ denotes the highest S1 level in the S1 levels of the host materials, and $E^S_{h\_min}$ denotes the lowest S1 level in the S1 levels of the host materials. Additionally, $E^T_{h\_MAX}$ denotes the highest T1 level in the T1 levels of the host materials, and $E^T_{h\_min}$ denotes the lowest T1 level in the T1 levels of the host materials. In FIG. 3A, $E^S_d$ denotes the S1 level of the fluorescent dopant material of the light-emitting layer 13, and $E^T_d$ the T1 level of the fluorescent dopant material of the light-emitting layer 13. In FIG. 3B, which illustrates exemplary energy levels of the respective layers of the sample that includes the organic light-emitting layer 13 containing two or more host materials, $E^S_{d\_MAX}$ denotes the highest S1 level in the S1 levels of the dopant materials, and $E^S_{d\_min}$ denotes the lowest S1 level in the S1 levels of the dopant materials. Additionally, $E^T_{d\_MAX}$ denotes the highest T1 level in the T1 levels of the dopant materials, and $E^T_{d\_min}$ denotes the lowest T1 level in the T1 levels of the dopant materials. In FIGS. 3A and 3B, $E^S_b$ denotes the S1 level of the electron transport layer 14, and $E^T_b$ denotes the T1 level of the electron transport layer 14.

[Method for Measuring S1 Levels]

The S1 levels may be calculated from absorption edges by means of optical absorption spectroscopy or from the difference between the highest occupied molecular orbital (HOMO) level and the lowest unoccupied molecular orbital (LUMO) level, for example. The HOMO level may be measured by means of atmospheric photoelectron spectroscopy, electrochemical method, such as cyclic voltammetry, or photoelectron spectroscopy (PES), for example. The LUMO level may be measured by means of inverse photoelectron spectroscopy (IPES), for example. In another embodiment, the HOMO and LUMO levels may be measured by means of molecular orbital calculation.

[Method for Measuring T1 Levels]

The T1 levels may be calculated from delayed fluorescence spectra in a coolant condition by means of photoluminescence spectroscopy or may be calculated by means of molecular orbital calculation, for example.

The hole transport layer 12 and the electron transport layer 14 of the organic electroluminescent element 1 may confine, in the light-emitting layer 13, triplet excitons generated in the light-emitting layer 13. The confined triplet excitons then collide and fuse with each other with a high frequency to produce singlet excitons. Such a phenomenon (hereinafter referred to as triplet-triplet fusion (TTF) phenomenon) increases the efficiency of fluorescent light emission. In one embodiment, $E^T_h$ (or $E^T_{h\_MAX}$) of the host material of the light-emitting layer 13 may be lower than $E^T_a$ of the hole transport layer 12 and $E^T_b$ of the electron transport layer 14. This prevents the triplet excitons in the host material of the light-emitting layer 13 from diffusing into the hole transport layer 12 and the electron transport layer 14. Additionally, $E^T_d$ (or $E^T_{d_{MAX}}$) of the fluorescent dopant material of the light-emitting layer 13 may be lower than $E^T_a$ of the hole transport layer 12 and $E^T_b$ of the electron transport layer 14. This prevents the triplet excitons in the fluorescent dopant material of the light-emitting layer 13 from diffusing into the hole transport layer 12 and the electron transport layer 14.

The light-emitting layer 13 of the organic electroluminescent element 1 may satisfy the relation $E^T_h < E^T_d$ (or $E^T_{h\_MAX} < E^T_{d\_min}$). The light-emitting layer 13 satisfying such a relation prevents the triplet excitons, generated through recombination of electrons and holes in the host material of the light-emitting layer 13, from moving to the fluorescent dopant material having a higher triplet energy. In contrast, the triplet excitons generated through recombination of electrons and holes in the fluorescent dopant material of the light-emitting layer 13 rapidly move to the host material of the light-emitting layer 13. Thus, the triplet excitons in the host material of the light-emitting layer 13 efficiently undergo the TTF phenomenon (i.e., collide and fuse with each other) to produce singlet excitons, while being prevented from moving to the fluorescent dopant material of the light-emitting layer 13. Additionally, $E^S_d$ (or $E^S_{d\_MAX}$) of the fluorescent dopant material of light-emitting layer 13 may be lower than $E^S_h$ (or $E^S_{h\_min}$) of the host material of the light-emitting layer 13. This allows the singlet excitons generated through the TTF phenomenon to move from the host material of the light-emitting layer 13 to the fluorescent dopant material of the light-emitting layer 13, contributing to fluorescent light emission of the fluorescent dopant material of the light-emitting layer 13. Such a relation of the triplet energy among the electron transport layer 14, the host material of the light-emitting layer 13, and the fluorescent dopant material of the light-emitting layer 13 facilitates efficient generation of the singlet excitons through the collision of the triplet excitons before thermal deactivation of the triplet excitons, resulting in an improvement in light emission efficiency.

Figure 4:
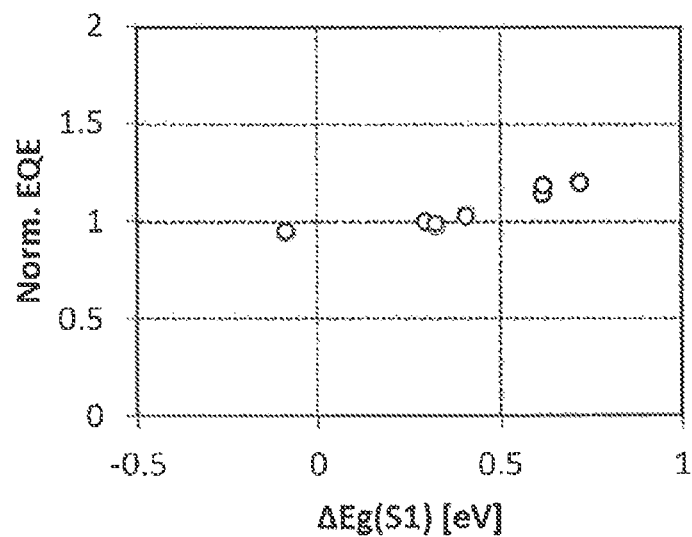
FIG. 4 illustrates an exemplary relation between S1 levels and external quantum efficiency.

FIG. 4 illustrates an exemplary relation between the S1 levels and external quantum efficiency. FIG. 4 is a plot of the results obtained by changing materials of the hole transport layer 12 and the electron transport layer 14. In FIG. 4, the vertical axis indicates normalized external quantum efficiency, and the horizontal axis indicates the sum of the S1 levels of the hole transport layer 12 and the electron transport layer 14 relative to the S1 level of the light-emitting layer 13. In view of FIGS. 3 and 4, the hole transport layer 12, the light-emitting layer 13, and the electron transport layer 14 satisfy the following expressions:

$$\Delta Eg(S1) \geq 0 \text{ eV} \qquad \text{Expression (A)}$$

$$\Delta Eg(S1) = E^S_a + E^S_b - 2 \times E^S_{EML} \qquad \text{Expression (B)}$$

where $E^S_a$ represents the S1 level of the hole transport layer 12, $E^S_b$ represents the S1 level of the electron transport layer 14, and $E^S_{EML}$ represents the S1 level (i.e., $E^S_b$ or $E^S_{h\_MAX}$) of the light-emitting layer 13.

The hole transport layer 12, the light-emitting layer 13, and the electron transport layer 14 that satisfy Expressions (A) and (B) enhance the efficiency in confining the excitons in the light-emitting layer 13.

Figure 5:
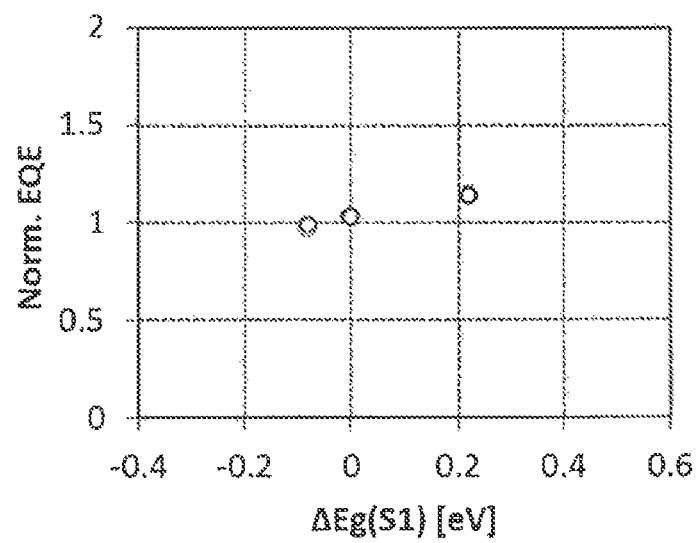
FIG. 5 illustrates an exemplary relation between S1 levels and external quantum efficiency.

FIG. 5 illustrates an exemplary relation between the S1 level of a transport layer on a non-emission side (i.e., the hole transport layer 12 in the present embodiment) relative to the S1 level of the light-emitting layer 13 and the external quantum efficiency. As used herein, the wording "transport layer on a non-emission side" refers to one of the hole transport layer 12 or the electron transport layer 14 that is more remote from the light-emitting region 13A than the other of the hole transport layer 12 or the electron transport layer 14. FIG. 5 is a plot of the results obtained by changing materials of the hole transport layer 12. In FIG. 5, the vertical axis indicates normalized external quantum efficiency, and the horizontal axis indicates the S1 level of the hole transport layer 12 relative to the S1 level of the light-emitting layer 13. In view of FIGS. 3 and 5, the hole transport layer 12, the light-emitting layer 13, and the electron transport layer 14 may satisfy the following expressions:

$$E^S_a > E^S_{EML} \quad \text{Expression (C)}$$

$$E^S_b > E^S_{EML} \quad \text{Expression (D)}$$

The hole transport layer 12, the light-emitting layer 13, and the electron transport layer 14 that satisfy Expressions (C) and (D) enhance the efficiency in confining the excitons in the light-emitting layer 13.

Figure 6:
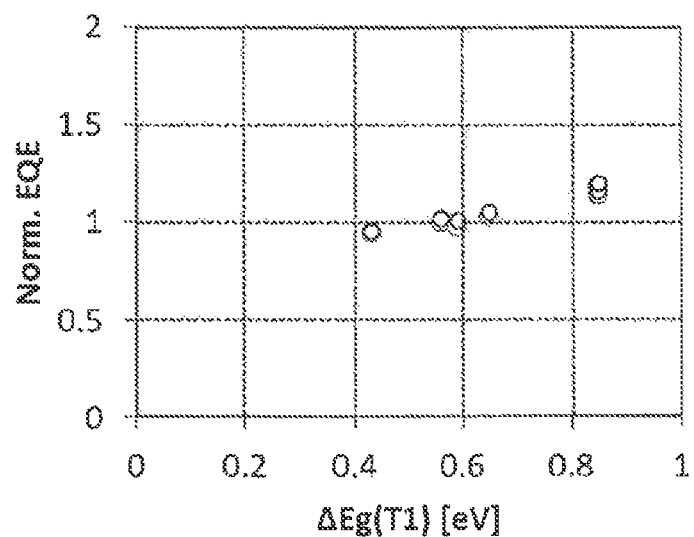
FIG. 6 illustrates an exemplary relation between T1 levels and external quantum efficiency.

FIG. 6 illustrates an exemplary relation between the T1 levels and external quantum efficiency. FIG. 6 is a plot of the results obtained by changing materials of the hole transport layer 12 and the electron transport layer 14. In FIG. 6, the vertical axis indicates normalized external quantum efficiency, and the horizontal axis indicates the sum of the T1 levels of the hole transport layer 12 and the electron transport layer 14 relative to the T1 level of the light-emitting layer 13. In view of FIGS. 3 and 6, the hole transport layer 12, the light-emitting layer 13, and the electron transport layer 14 may satisfy the following expressions:

$$\Delta Eg(T1) \geq 0 \text{ eV} \quad \text{Expression (E)}$$

$$\Delta Eg(T1) = E^T_a + E^T_b - 2 \times E^T_{EML} \quad \text{Expression (F)}$$

where $E^T_a$ represents the T1 level of the hole transport layer 12, $E^T_b$ represents the T1 level of the electron transport layer 14, and $E^T_{EML}$ represents the T1 level (i.e., $E^T_a$ or $E^T_{d\_MAX}$) of the light-emitting layer 13.

The hole transport layer 12, the light-emitting layer 13, and the electron transport layer 14 that satisfy Expressions (E) and (F) enhance the efficiency in confining the excitons in the light-emitting layer 13.

Figure 7:
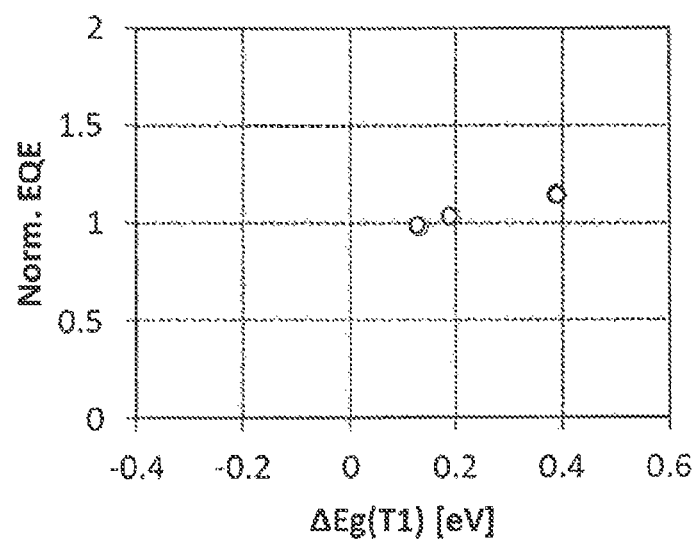
FIG. 7 illustrates an exemplary relation between T1 levels and external quantum efficiency.

FIG. 7 illustrates an exemplary relation between the T1 level of the transport layer on a non-emission side (i.e., the hole transport layer 12 in the present embodiment) and the external quantum efficiency. FIG. 7 is a plot of the results obtained by changing materials of the hole transport layer 12. In FIG. 7, the vertical axis indicates normalized external quantum efficiency, and the horizontal axis indicates the T1 level of the hole transport layer 12 relative to the T1 level of the light-emitting layer 13. In view of FIGS. 3 and 7, the hole transport layer 12, the light-emitting layer 13, and the electron transport layer 14 may satisfy the following expressions:

$$E^T_a > E^T_{EML} \quad \text{Expression (G)}$$

$$E^T_b > E^T_{EML} \quad \text{Expression (H)}$$

The hole transport layer 12, the light-emitting layer 13, and the electron transport layer 14 that satisfy Expression (G) and (H) enhance the efficiency in confining the excitons in the light-emitting layer 13.

Although FIGS. 4 to 7 illustrate the results obtained from the samples each including the light-emitting layer 13 including the blue organic material, Expressions (A) to (H) may be true even if the light-emitting layer 13 includes another organic material, such as a red or green organic material, instead of the blue organic material.

[Effects]

Described below are some effects of the organic electroluminescent element 1 of the present embodiment.

A typical organic electroluminescent unit accumulates electric charge fed from a hole transport layer at an interface between an electron transport layer and a light-emitting layer to efficiently produce excitons. Such an organic electroluminescent unit has a light-emitting region adjacent to the electron transport layer. The electron transport layer includes a material having a high S1 level so as not to cause thermal deactivation of the generated excitons. Unfortunately, this configuration has failed to exercise sufficient light-emitting capacity or performance of the light-emitting layer.

In contrast, the hole transport layer 12, the light-emitting layer 13, and the electron transport layer 14 of the present embodiment satisfy Expressions (A) and (B) described above. These layers enhance the efficiency in confining the excitons in the light-emitting layer 13, resulting in an improvement in the light-emitting capacity or performance of the organic electroluminescent element.

Additionally, the hole transport layer 12, the light-emitting layer 13, and the electron transport layer 14 of the present embodiment may satisfy Expressions (C) and (D) described above. These layers enhance the efficiency in confining the excitons in the light-emitting layer 13, resulting in an improvement in the light-emitting capacity or performance of the organic electroluminescent element.

The light-emitting layer 13 of the present embodiment may have hole mobility higher than electron mobility. This allows the light-emitting region 13A to reside in the portion adjacent to the electron transport layer 14. The hole transport layer 12 and the electron transport layer 14 may include a material having a high S1 level so as not to cause thermal deactivation of excitons. This helps to enhance the light-emitting capacity or performance of the organic electroluminescent element.

Even if the hole transport layer 12 is an insolubilized coated film, the excitons are efficiently confined in the light-emitting layer 13 in the present embodiment. Accordingly, a decrease in the light-emitting capacity or performance of the organic electroluminescent element is suppressed.

Additionally, the hole transport layer 12, the light-emitting layer 13, and the electron transport layer 14 of the present embodiment may satisfy Expressions (E) and (F) described above. These layers enhance the efficiency in confining the excitons in the light-emitting layer 13, resulting in an improvement in the light-emitting capacity or performance of the organic electroluminescent element.

Furthermore, the hole transport layer 12, the light-emitting layer 13, and the electron transport layer 14 of the present embodiment may satisfy Expressions (G) and (H) described above. These layers enhance the efficiency in confining the excitons in the light-emitting layer 13, resulting in an improvement in the light-emitting capacity or performance of the organic electroluminescent element.

2. Modification Example of First Embodiment

Figure 8:
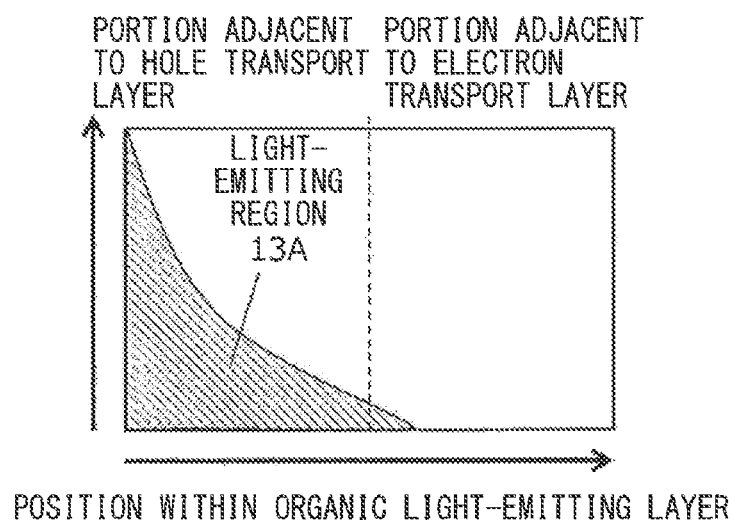
FIG. 8 illustrates a modification example of the light-emitting region in the light-emitting layer of FIG. 1.

FIG. 8 illustrates a modification example of the light-emitting region 13A in the light-emitting layer 13 of the first embodiment. In the first embodiment, the light-emitting region 13A in the light-emitting layer 13 may reside in the portion adjacent to the electron transport layer 14. In another embodiment, the light-emitting region 13A in the light-emitting layer 13 may reside in the portion adjacent to the hole transport layer 12, as in FIG. 8, for example.

As used herein, the wording "the light-emitting region 13A may reside in the portion adjacent to the hole transport layer 12" refers to, for example, that 90% or more of the light-emitting region 13A in the light-emitting layer 13 resides in the portion adjacent to the hole transport layer 12, as in FIG. 8. Note that the light-emitting region 13A in FIG. 8 is a mere example. A peak of the light-emitting region 13A may possibly position at an internal portion of the light-emitting layer 13 instead of at the interface of the light-emitting layer 13, for example. The light-emitting region 13A may be changed, for example, by controlling the ration between the host material and the fluorescent dopant material contained in the light-emitting layer 13.

The hole transport layer 12, the light-emitting layer 13, and the electron transport layer 14 of the present modification example may satisfy Expressions (A) and (B) described above. These layers enhance the efficiency in confining the excitons in the light-emitting layer 13, resulting in an improvement in the light-emitting capacity or performance of the organic electroluminescent element.

Additionally, the hole transport layer 12, the light-emitting layer 13, and the electron transport layer 14 of the present modification example may satisfy Expressions (C) and (D) described above. These layers enhance the efficiency in confining the excitons in the light-emitting layer 13, resulting in an improvement in the light-emission capacity or performance of the organic electroluminescent element.

The light-emitting layer 13 of the present modification example may have electron mobility higher than hole mobility. This allows the light-emitting region 13A to reside in the portion adjacent to the hole transport layer 12. The hole transport layer 12 and the electron transport layer 14 may include a material having a high S1 level so as not to cause thermal deactivation of excitons. This helps to enhance the light-emitting capacity or performance of the organic electroluminescent element.

Additionally, the hole transport layer 12, the light-emitting layer 13, and the electron transport layer 14 of the present modification example may satisfy Expressions (E) and (F) described above. These layers enhance the efficiency in confining the excitons in the light-emitting layer 13, resulting in an improvement in the light-emitting capacity or performance of the organic electroluminescent element.

Furthermore, the hole transport layer 12, the light-emitting layer 13, and the electron transport layer 14 of the present modification example may satisfy Expressions (G) and (H) described above. These layers enhance the efficiency in confining the excitons in the light-emitting layer 13, resulting in an improvement in the light-emitting capacity or performance of the organic electroluminescent element.

3. Second Embodiment

Configuration

Figure 9:
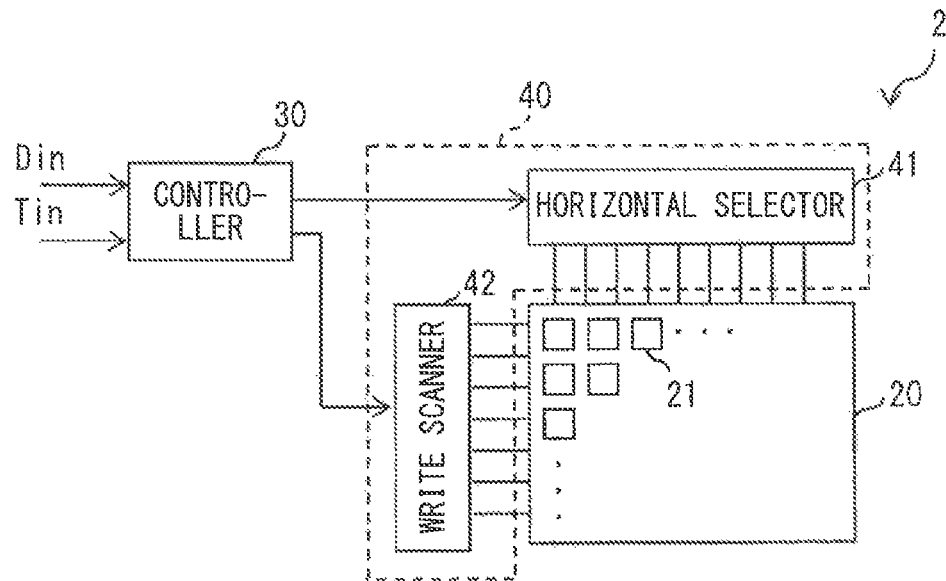
FIG. 9 illustrates an exemplary outline configuration of an organic electroluminescent unit according to one embodiment of the disclosure.
Figure 10:
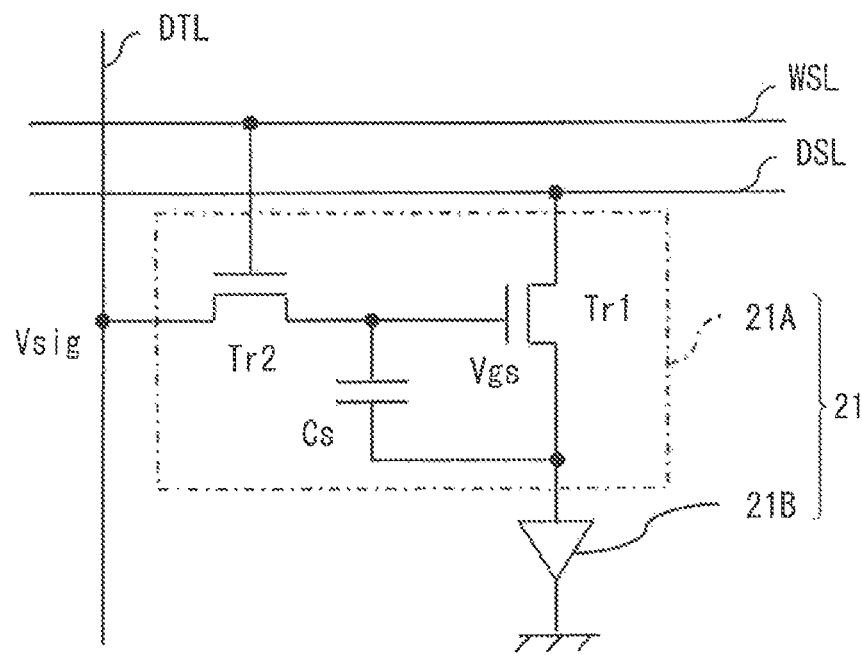
FIG. 10 illustrates an exemplary circuit configuration of a pixel illustrated in FIG. 9.

FIG. 9 illustrates an exemplary outline configuration of an organic electroluminescent unit 2 of a second embodiment of the disclosure. FIG. 10 illustrates an exemplary circuit configuration of a pixel 21 in the organic electroluminescent unit 2. The organic electroluminescent unit 2 may include, for example, a display panel 20, a controller 30, and a driver 40. The driver 40 may be mounted on an outer edge portion of the display panel 20. The display panel 20 may include a plurality of pixels 21 that are arranged in matrix. The controller 30 and the driver 40 may drive the display panel 20 (i.e., the pixels 21) on the basis of an image signal Din and a synchronizing signal Tin received from an external device.

[Display Panel 20]

In response to the active-matrix driving of the pixels 21 performed by the controller 30 and the driver 40, the display panel 20 may display an image based on the image signal Din and the synchronizing signal Tin received from the external device. The display panel 20 may include a plurality of scanning lines WSLs and a plurality of power lines DSLs both extending in a row direction, a plurality of signal lines DTLs extending in a column direction, and the plurality of pixels 21 arranged in matrix.

The scanning lines WSLs may be used for selection of the pixels 21. In detail, the scanning lines WSLs may supply a selection pulse to the respective pixels 21 to select the pixels 21 on a predetermined unit basis (e.g., on a pixel-row basis). The signal lines DTLs may supply, to the respective pixels 21, a signal voltage Vsig corresponding to the image signal Din. In detail, the signal lines DTLs may supply, to the respective pixels 21, a data pulse including the signal voltage Vsig. The power lines DSLs may supply electric power to the respective pixels 21.

The plurality of pixels 21 may include ones emitting red light, ones emitting green light, and ones emitting blue light, for example. Optionally, the pixels 21 may further include ones emitting light in another color, such as white or yellow.

The signal lines DTLs may be each coupled to an output end of a horizontal selector 41 described below. Each of the signal lines DTLs may be assigned to a corresponding pixel column, for example. The scanning lines WSLs may be each coupled to an output end of a write scanner 42 described below. Each of the scanning lines WSLs may be assigned to a corresponding pixel row, for example. The power lines DSLs may be each coupled to an output end of a power source. Each of the power lines DSLs may be each assigned to a corresponding pixel row, for example.

The pixels 21 may each include, for example, a pixel circuit 21A and an organic electroluminescent element 21B. The organic electroluminescent element 21B may be, for example, the organic electroluminescent element 1 of any embodiment of the disclosure. At least one of the pixels 21 in the display panel 20 may include the organic electroluminescent element 1 of any embodiment of the disclosure. In other words, at least one of the organic electroluminescent elements 21B in the display panel 20 may be the organic electroluminescent element 1 of any embodiment of the disclosure. For example, the pixels 21 emitting blue light may each include, as the organic electroluminescent element 21B, the organic electroluminescent element 1 of any embodiment of the disclosure.

The pixel circuit 21A may control light emission and light extinction of the organic electroluminescent element 21B. The pixel circuit 21A may hold a voltage written into the corresponding pixel 21 through write scanning described below. The pixel circuit 21A may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may be based on the image signal Din. In one embodiment, the switching transistor Tr2 may sample a voltage of the signal line DTL and write the sampled voltage into the gate of the driving transistor Tr1. The driving transistor Tr1 may be coupled in series to the organic electroluminescent element 21B. The driving transistor Tr1 may drive the organic electroluminescent element 21B. The driving transistor Tr1 may control an electric current flowing through the organic electroluminescent element 21B on the basis of the magnitude of the voltage sampled at the switching transistor Tr2. The storage capacitor Cs may hold a predetermined voltage between the gate and a source of the driving transistor Tr1. The storage capacitor Cs may keep a gate-source voltage Vgs of the driving transistor Tr1 at a constant level for a predetermined period. Note that the pixel circuit 21A may have a circuit configuration that includes the 2Tr1C circuit described above and additional capacitors and transistors. In another embodiment, the pixel circuit 21A may have a circuit configuration different from that of the 2Tr1C circuit described above.

Each of the signal lines DTLs may be coupled to an output end of the horizontal selector 41 described below and a source or a drain of the switching transistor Tr2. Each of the scanning lines WSLs may be coupled to an output end of the write scanner 42 described below and a gate of the switching transistor Tr2. Each of the power lines DSLs may be coupled to an output end of a power supply circuit 33 and the source or a drain of the driving transistor Tr1.

The gate of the switching transistor Tr2 may be coupled to the corresponding scanning line WSL. One of the source or the drain of the switching transistor Tr2 may be coupled to the signal line DTL. The other of the source or the drain, which is not coupled to the signal line DTL, of the switching transistor Tr2 may be coupled to the gate of the driving transistor Tr1. One of the source or the drain of the driving transistor Tr1 may be coupled to the corresponding power line DSL. The other of the source or the drain, which is not coupled to the power line DSL, of the driving transistor Tr1 may be coupled to the anode 11 of the organic electroluminescent element 21B. One end of the storage capacitor Cs may be coupled to the gate of the driving transistor Tr1. The other end of the storage capacitor Cs may be coupled to one of the source or the drain, adjacent to the organic electroluminescent element 21B, of the driving transistor Tr1.

[Driver 40]

The driver 40 may include the horizontal selector 41 and the write scanner 42, for example. The horizontal selector 41 may apply the analog signal voltage Vsig to each of the signal lines DTLs, in response to or in synchronization with a control signal, for example. The analog signal voltage Vsig may be transmitted from the controller 30. The write scanner 42 may scan the pixels 21 on a predetermined unit basis.

[Controller 30]

The controller 30 is described in detail below. The controller 30 may perform predetermined correction on the digital image signal Din and generate the signal voltage Vsig on the basis of the image signal obtained through the predetermined correction, for example. The image signal Din may be transmitted from an external device, for example. The controller 30 may output the generated signal voltage Vsig to the horizontal selector 41, for example. The controller 30 may transmit a control signal to each circuit in the driver 40, in response to or in synchronization with the synchronizing signal Tin. The synchronizing signal may be transmitted from an external device, for example.

[Effects]

In the present embodiment, at least one of the organic electroluminescent elements 21B in the display panel 20 may be the organic electroluminescent element 1 of any embodiment of the disclosure. Consequently, the organic electroluminescent unit 2 exhibits high light emission efficiency.

4. Application Examples

Application Example 1

Described below is an application example of the organic electroluminescent unit 2 of the second embodiment. The organic electroluminescent unit 2 is applicable to a variety of display units of electronic apparatuses that display, as images or pictures, image signals received from external devices or generated inside the display units. Non-limiting examples of the electronic apparatuses may include televisions, digital cameras, notebook personal computers, sheet-like personal computers, portable terminal devices such as mobile phones, and video cameras.

Figure 11:
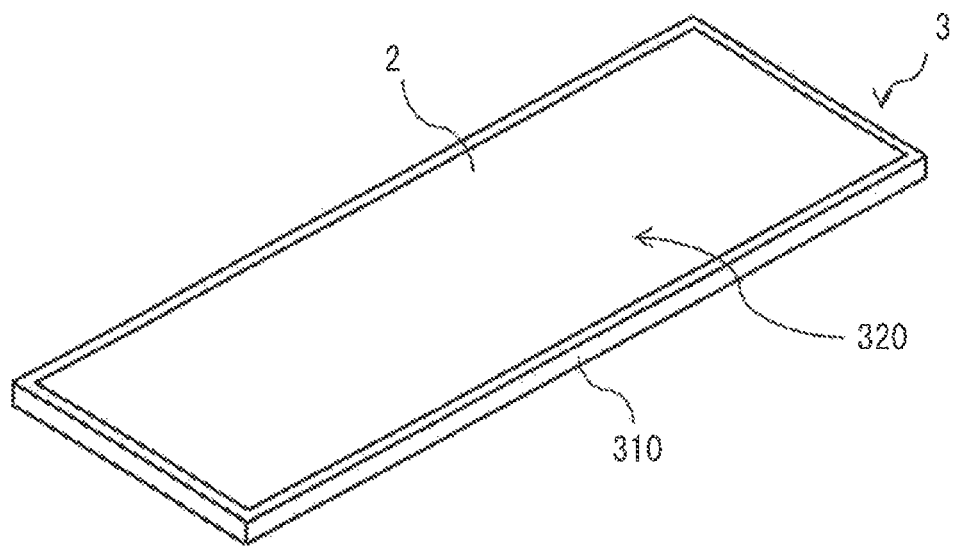
FIG. 11 is a perspective view of an exemplary external appearance of an electronic apparatus with the organic electroluminescent unit according to one embodiment of the disclosure.

FIG. 11 is a perspective view of an external appearance of an electronic apparatus 3 of the present application example. The electronic apparatus 3 may be, for example, a sheet-like personal computer including a body 310 having a display surface 320 on a main face. The organic electroluminescent unit 2 may be provided on the display surface 320 of the electronic apparatus 3. The organic electroluminescent unit 2 may be disposed such that the display panel 20 faces outward. The electronic apparatus 3 of the present application example including the organic electroluminescent unit 2 on the display surface 320 exhibits high light emission efficiency.

Application Example 2

Described below is an application example of the organic electroluminescent element 1 of the first embodiment. The organic electroluminescent element 1 is applicable to a variety of light sources in illumination apparatuses for table lightings, or floor lightings, and room lightings.

Figure 12:
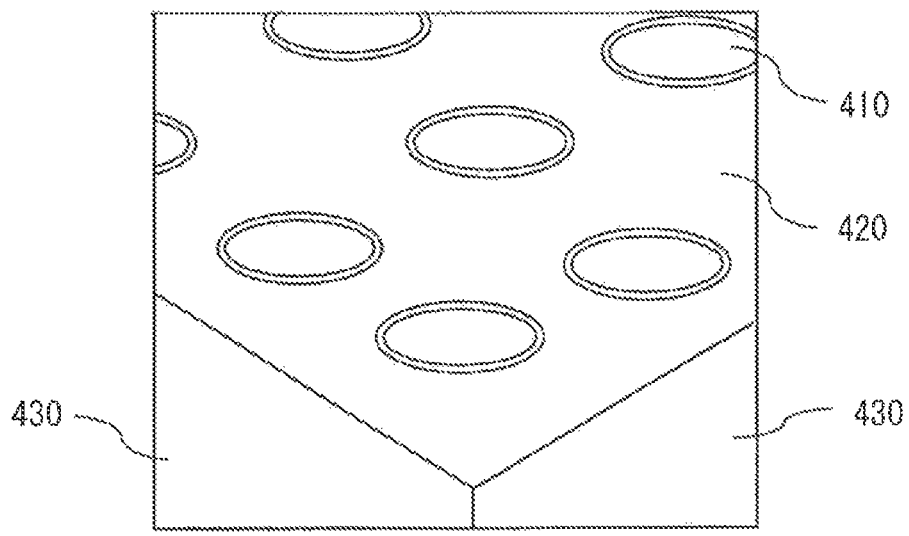
FIG. 12 is a perspective view of an exemplary external appearance of an illumination apparatus with the organic electroluminescent elements according to one embodiment of the disclosure.

FIG. 12 illustrates an external appearance of an illumination apparatus for a room lighting to which the organic electroluminescent elements 1 are applied. The illumination apparatus may include, for example, illuminating sections 410 each including one or more of the organic electroluminescent elements 1. An appropriate number of the illuminating sections 410 are disposed at appropriate intervals on a ceiling 420. Note that the illuminating sections 410 may be installed on any place other than the ceiling 420, such as a wall 430 and a non-illustrated floor, depending on the intended use.

The illumination apparatus may perform illumination with light emitted from the organic electroluminescent elements 1. Accordingly, the illumination apparatus exhibits high light emission efficiency.

Although the disclosure is described hereinabove with reference to the embodiments, modification examples, and application examples, these embodiments, modification examples, and application examples are not to be construed as limiting the scope of the disclosure and may be modified in a wide variety of ways. It should be noted that the effects described hereinabove are mere examples. Effects of an embodiment of the disclosure are not limited to those described hereinabove. The disclosure may further include any effects other than those described hereinabove.

Moreover, the disclosure may have the following configurations, for example.

(1) An organic electroluminescent unit provided with a plurality of organic electroluminescent elements, at least one of the plurality of organic electroluminescent elements including, in order:
a first electrode;
a hole transport layer;
a light-emitting layer;
an electron transport layer; and
a second electrode,
the hole transport layer, the light-emitting layer, and the electron transport layer satisfying the following expressions:

$$\Delta Eg(T1) \geq 0 \text{ eV} \qquad \text{Expression (1)}$$

$$\Delta Eg(T1) = E^T_a + E^T_b - 2 \times E^T_{EML} \qquad \text{Expression (2)}$$

where $E^T_a$ represents a T1 level of the hole transport layer, $E^T_b$ represents a T1 level of the electron transport layer, and $E^T_{EML}$ represents a T1 level of the light-emitting layer.

(2) The organic electroluminescent unit according to (1), in which
the light-emitting layer has a light-emitting region, the light-emitting region in the light-emitting layer residing in a portion adjacent to the electron transport layer, and
the hole transport layer, the light-emitting layer, and the electron transport layer satisfy the following expressions:

$$E^T_a > E^T_{EML}$$

$$E^T_b > E^T_{EML}.$$

(3) The organic electroluminescent unit according to (2), in which the light-emitting layer has hole mobility higher than electron mobility.

(4) The organic electroluminescent unit according to (1), in which
the light-emitting layer has a light-emitting region, the light-emitting region in the light-emitting layer residing in a portion adjacent to the hole transport layer, and
the hole transport layer, the light-emitting layer, and the electron transport layer satisfy the following expressions:

$$E^T_a > E^T_{EML}$$

$$E^T_b > E^T_{EML}.$$

(5) The organic electroluminescent unit according to (4), in which the light-emitting layer has electron mobility higher than hole mobility.

(6) The organic electroluminescent unit according any one of (1) to (5), in which
the hole transport layer is an insolubilized coated film, and
the light-emitting layer is a coated film.

(7) An organic electroluminescent unit provided with a plurality of organic electroluminescent elements, at least one of the plurality of organic electroluminescent elements including, in order:
a first electrode;
a hole transport layer;
a light-emitting layer;
an electron transport layer; and
a second electrode,
the light-emitting layer having a light-emitting region, the light-emitting region in the light-emitting layer residing in a portion adjacent to one of the hole transport layer or the electron transport layer,
the hole transport layer, the light-emitting layer, and the electron transport layer satisfying the following expression:

$$E^T_{ULL} > E^T_{EML} \qquad \text{Expression (3)}$$

where $E^T_{ULL}$ represents a T1 level of one of the hole transport layer or the electron transport layer that is more remote from the light-emitting region than the other of the hole transport layer or the electron transport layer, and $E^T_{EML}$ represents a T1 level of the light-emitting layer.

(8) An organic electroluminescent unit provided with a plurality of organic electroluminescent elements, at least one of the plurality of organic electroluminescent elements including, in order:
a first electrode;
a hole transport layer;
a light-emitting layer;
an electron transport layer; and
a second electrode,
the hole transport layer, the light-emitting layer, and the electron transport layer satisfying the following expressions:

$$\Delta Eg(S1) \geq 0 \text{ eV} \qquad \text{Expression (4)}$$

$$\Delta Eg(S1) = E^S_a + E^S_b - 2 \times E^S_{EML} \qquad \text{Expression (5)}$$

where $E^S_a$ represents an S1 level of the hole transport layer, $E^S_b$ represents an S1 level of the electron transport layer, and $E^S_{EML}$ represents an S1 level of the light-emitting layer.

(9) The organic electroluminescent unit according to (8), in which
the light-emitting layer has a light-emitting region, the light-emitting region in the light-emitting layer residing in a portion adjacent to the electron transport layer, and
the hole transport layer, the light-emitting layer, and the electron transport layer satisfy the following expressions:

$$E^S_a > E^S_{EML}$$

$$E^S_b > E^S_{EML}.$$

(10) The organic electroluminescent unit according to (9), in which the light-emitting layer has hole mobility higher than electron mobility.

(11) The organic electroluminescent unit according to (8), in which
the light-emitting layer has a light-emitting region, the light-emitting region in the light-emitting layer residing in a portion adjacent to the hole transport layer, and
the hole transport layer, the light-emitting layer, and the electron transport layer satisfy the following expressions:

$$E^S_a > E^S_{EML}$$

$$E^S_b > E^S_{EML}.$$

(12) The organic electroluminescent unit according to (11), in which the light-emitting layer has electron mobility higher than hole mobility.

(13) The organic electroluminescent unit according to any one of (8) to (12), in which
the hole transport layer is an insolubilized coated film, and
the light-emitting layer is a coated film.

(14) An organic electroluminescent unit provided with a plurality of organic electroluminescent elements, at least one of the plurality of organic electroluminescent elements including, in order:
a first electrode;
a hole transport layer;
a light-emitting layer;
an electron transport layer, and
a second electrode, the light-emitting layer having a light-emitting region, the light-emitting region in the light-emitting layer residing in a portion adjacent to one of the hole transport layer or the electron transport layer, the hole transport layer, the light-emitting layer, and the electron transport layer satisfying the following expression:

$$E^S{}_{ULL} > E^S{}_{EML} \quad \text{Expression (6)}$$

where $E^S{}_{ULL}$ represents an S1 level of one of the hole transport layer or the electron transport layer that is more remote from the light-emitting region than the other of the hole transport layer or the electron transport layer, and $E^S{}_{EML}$ represents an S1 level of the light-emitting layer.

In the organic electroluminescent unit according to (1) of the disclosure, the hole transport layer, light-emitting layer, and the electron transport layer satisfy Expressions (1) and (2) described above. This makes it possible to enhance the performance of the organic electroluminescent element.

In the organic electroluminescent unit according to (7) of the disclosure, the hole transport layer, the light-emitting layer, and the electron transport layer satisfy Expression (3) described above. This makes it possible to enhance the performance of the organic electroluminescent element.

In the organic electroluminescent unit according to (8) of the disclosure, the hole transport layer, the light-emitting layer, and the electron transport layer satisfy Expressions (4) and (5) described above. This makes it possible to enhance the performance of the organic electroluminescent element.

In the organic electroluminescent element according to (14) of the disclosure, the hole transport layer, the light-emitting layer, and the electron transport layer satisfy Expression (6) described above. This makes it possible to enhance the performance of the organic electroluminescent element.

It should be noted that the description hereinabove is merely exemplified. The effects of the disclosure are not limited to those described hereinabove. The disclosure may include some effects different from those described hereinabove and may further include additional effects.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. An organic electroluminescent unit provided with a plurality of organic electroluminescent elements, at least one of the plurality of organic electroluminescent elements comprising, in order:
   a first electrode;
   a hole transport layer;
   a light-emitting layer;
   an electron transport layer; and
   a second electrode,
   the hole transport layer, the light-emitting layer, and the electron transport layer satisfying the following expressions:

$$\Delta Eg(T1) \geq 0 \text{ eV}$$

$$\Delta Eg(T1) = ETa + ETb - 2 \times ETEML$$

where $\Delta Eg$ represents a change in energy, ETa represents a T1 (triplet energy) level of the hole transport layer, ETb represents a T1 (triplet energy) level of the electron transport layer, and ETEML represents a T1 (triplet energy) level of the light-emitting layer, wherein the light-emitting layer is between the hole transport layer and the electron transport layer.

2. The organic electroluminescent unit according to claim 1, wherein
   the light-emitting layer has a light-emitting region, the light-emitting region in the light-emitting layer residing in a portion adjacent to the electron transport layer, and
   the hole transport layer, the light-emitting layer, and the electron transport layer satisfy the following expressions:

$$ETa > ETEML$$

$$ETb > ETEML.$$

3. The organic electroluminescent unit according to claim 2, wherein the light-emitting layer has hole mobility higher than electron mobility.

4. The organic electroluminescent unit according to claim 1, wherein
   the light-emitting layer has a light-emitting region, the light-emitting region in the light-emitting layer residing in a portion adjacent to the hole transport layer, and
   the hole transport layer, the light-emitting layer, and the electron transport layer satisfy the following expressions:

$$ETa > ETEML$$

$$ETb > ETEML.$$

5. The organic electroluminescent unit according to claim 4, wherein the light-emitting layer has electron mobility higher than hole mobility.

6. The organic electroluminescent unit according to claim 1, wherein
   the hole transport layer comprises an insolubilized coated film, and
   the light-emitting layer comprises a coated film.

7. An organic electroluminescent unit provided with a plurality of organic electroluminescent elements, at least one of the plurality of organic electroluminescent elements comprising, in order:
   a first electrode;
   a hole transport layer;
   a light-emitting layer;
   an electron transport layer; and
   a second electrode,
   the light-emitting layer having a light-emitting region, the light-emitting region in the light-emitting layer residing in a portion adjacent to one of the hole transport layer or the electron transport layer,
   the hole transport layer, the light-emitting layer, and the electron transport layer satisfying the following expression:

$$ETULL > ETEML$$

where ETULL represents a T1 (triplet energy) level of one of the hole transport layer or the electron transport layer that is more remote from the light-emitting region than the other of the hole transport layer or the electron transport layer, and ETEML represents a T1 (triplet energy) level of the light-emitting layer, wherein the light-emitting layer is between the hole transport layer and the electron transport layer.

8. An organic electroluminescent unit provided with a plurality of organic electroluminescent elements, at least one of the plurality of organic electroluminescent elements comprising, in order:
- a first electrode;
- a hole transport layer;
- a light-emitting layer;
- an electron transport layer; and
- a second electrode,
- the hole transport layer, the light-emitting layer, and the electron transport layer satisfying the following expressions:

$\Delta Eg(S1) \geq 0$ eV $\Delta Eg(S1) = ESa + ESb - 2 \times ETEML$ where $\Delta Eg$ represents a change in energy, ESa represents an S1 (singlet energy) level of the hole transport layer, ESb represents an S1 (singlet energy) level of the electron transport layer, and ESEML represents an S1 (singlet energy) level of the light-emitting layer, wherein the light-emitting layer is between the hole transport layer and the electron transport layer.

9. The organic electroluminescent unit according to claim 8, wherein
the light-emitting layer has a light-emitting region, the light-emitting region in the light-emitting layer residing in a portion adjacent to the electron transport layer, and
the hole transport layer, the light-emitting layer, and the electron transport layer satisfy the following expressions:

$ESa > ESEML$ $ESb > ESEML$.

10. The organic electroluminescent unit according to claim 9, wherein the light-emitting layer has hole mobility higher than electron mobility.

11. The organic electroluminescent unit according to claim 8, wherein
the light-emitting layer has a light-emitting region, the light-emitting region in the light-emitting layer residing in a portion of adjacent to the hole transport layer, and
the hole transport layer, the light-emitting layer, and the electron transport layer satisfy the following expressions:

$ESa > ESEML$ $ESb > ESEML$.

12. The organic electroluminescent unit according to claim 11, wherein the light-emitting layer has electron mobility higher than hole mobility.

13. The organic electroluminescent unit according to claim 8, wherein
the hole transport layer comprises an insolubilized coated film, and
the light-emitting layer comprises a coated film.

14. An organic electroluminescent unit provided with a plurality of organic electroluminescent elements, at least one of the plurality of organic electroluminescent elements comprising, in order:
- a first electrode;
- a hole transport layer;
- a light-emitting layer,
- an electron transport layer, and
- a second electrode,
- the light-emitting layer having a light-emitting region, the light-emitting region in the light-emitting layer residing in a portion adjacent to one of the hole transport layer or the electron transport layer,
- the hole transport layer, the light-emitting layer, and the electron transport layer satisfying the following expression:

$ESULL > ESEML$ where ESULL represents an S1 (singlet energy) level of one of the hole transport layer or the electron transport layer that is more remote from the light-emitting region than the other of the hole transport layer or the electron transport layer, and ESEML represents an S1 (singlet energy) level of the light-emitting layer, wherein the light-emitting layer is between the hole transport layer and the electron transport layer.

* * * * *